United States Patent
Yim et al.

(10) Patent No.: US 9,164,211 B2
(45) Date of Patent: Oct. 20, 2015

(54) DISPLAY APPARATUS CAPABLE OF CONTROLLING LIGHT TRANSMITTANCE

(71) Applicants: Sang-Hoon Yim, Yongin (KR); Kwan-Hyun Cho, Yongin (KR); Kyung-Ho Kim, Yongin (KR); Young-Woo Song, Yongin (KR)

(72) Inventors: Sang-Hoon Yim, Yongin (KR); Kwan-Hyun Cho, Yongin (KR); Kyung-Ho Kim, Yongin (KR); Young-Woo Song, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 222 days.

(21) Appl. No.: 13/765,816

(22) Filed: Feb. 13, 2013

(65) Prior Publication Data

US 2013/0329288 A1   Dec. 12, 2013

(30) Foreign Application Priority Data

Jun. 7, 2012 (KR) .................. 10-2012-0061081

(51) Int. Cl.
*G02B 5/30* (2006.01)
*H01L 51/52* (2006.01)
*H01L 27/32* (2006.01)

(52) U.S. Cl.
CPC ............... *G02B 5/3083* (2013.01); *G02B 5/30* (2013.01); *H01L 27/326* (2013.01); *H01L 27/3232* (2013.01); *H01L 51/5281* (2013.01); *H01L 2251/5323* (2013.01)

(58) Field of Classification Search
CPC ............ H01L 51/5281; H01L 27/3232; H01L 2251/5323; G02B 5/3083; G02B 5/30
USPC .................. 359/483.01, 485.03, 489.07, 63, 359/485.01; 349/96, 114, 115, 117, 119, 99
See application file for complete search history.

(56) References Cited

U.S. PATENT DOCUMENTS

| | | | |
|---|---|---|---|
| 6,774,977 B1 | 8/2004 | Walton et al. | |
| 7,102,715 B2 | 9/2006 | Kim et al. | |
| 7,920,233 B2 | 4/2011 | Hamilton et al. | |
| 2001/0055082 A1* | 12/2001 | Kubo et al. | 349/114 |
| 2005/0134773 A1 | 6/2005 | Park et al. | |
| 2012/0268696 A1 | 10/2012 | Yim et al. | |
| 2012/0327331 A1 | 12/2012 | Yim et al. | |

FOREIGN PATENT DOCUMENTS

| | | |
|---|---|---|
| JP | 2005-114983 A | 4/2005 |
| KR | 10-0283275 B1 | 12/2000 |
| KR | 2002-0064293 A | 8/2002 |

(Continued)

OTHER PUBLICATIONS

Korean Notice of Allowance dated Nov. 20, 2013.

*Primary Examiner* — Ricky Mack
*Assistant Examiner* — Mustak Choudhury
(74) *Attorney, Agent, or Firm* — Lee & Morse, P.C.

(57) ABSTRACT

A display apparatus includes a transparent display device with a first region displaying images, a second region transmitting external light, the first and second regions being adjacent to each other and alternating in a first direction, a first polarizer on an optical path emitted by the transparent display device and configured to linearly polarize the external light, a first retarder between the first polarizer and the transparent display device to delay a phase of the external light, a second polarizer on the transparent display device to linearly polarize the external light, and a pattern retarder between the second polarizer and the transparent display device, the pattern retarder including a second retarder to delay a wavelength of the external light by a first phase and a third retarder to delay the wavelength by a second phase, the second and third retarders being alternately arranged in the first direction.

27 Claims, 11 Drawing Sheets

(56) References Cited

FOREIGN PATENT DOCUMENTS

| KR | 10-2005-0060847 A | 6/2005 |
| KR | 10-0518426 B1 | 9/2005 |
| KR | 10-2007-0027918 A | 3/2007 |
| KR | 20070027918 A * | 3/2007 |

* cited by examiner

DISPLAY APPARATUS CAPABLE OF CONTROLLING LIGHT TRANSMITTANCE

CROSS-REFERENCE TO RELATED PATENT APPLICATION

This application claims the benefit of Korean Patent Application No. 10-2012-0061081, filed on Jun. 7, 2012, in the Korean Intellectual Property Office, the disclosure of which is incorporated herein in its entirety by reference.

BACKGROUND

1. Field

Example embodiments relate to a display apparatus, and more particularly, to a display apparatus that changes light transmittance according to modes.

2. Description of the Related Art

Since an organic light-emitting display apparatus has excellent characteristics in terms of viewing angles, contrast, response speeds, and power consumption, an application range of the organic light-emitting display apparatus has been increased from a personal portable device, e.g., a MP3 player or a mobile phone, to a TV. Such an organic light-emitting display device has a self-emission characteristic and does not require a separate light source, e.g., unlike a liquid crystal display device. Thus, thickness and weight of the organic light-emitting display device may be decreased. Also, the organic light-emitting display device may be configured as a transparent display device by forming a transparent thin film transistor or a transparent organic light-emitting diode therein and forming a transmissive region (transmissive window) separately from a pixel region.

SUMMARY

Example embodiments provide a low power display apparatus with a light transmittance control by using a minimal number of elements of a transparent display device.

According to an aspect of the example embodiments, there is provided a display apparatus capable of controlling light transmittance, the display apparatus including a transparent display device including first and second regions, the first region being configured to display images, the second region being configured to transmit external light therethrough, and the first and second regions being adjacent to each other and being alternately arranged in a first direction, a first polarizer on the transparent display device, the first polarizer being in an optical path of light emitted by the transparent display device and being configured to linearly polarize the external light, a first retarder between the first polarizer and the transparent display device, the first retarder being configured to delay a phase of the external light, a second polarizer on the transparent display device, the second polarizer being on an opposite surface of the transparent display device relative to the first polarizer and being configured to linearly polarize the external light, and a pattern retarder between the second polarizer and the transparent display device, the pattern retarder including a second retarder configured to delay a wavelength of the external light by a first phase and a third retarder configured to delay the wavelength by a second phase, the second and third retarders being alternately arranged in the first direction.

The first retarder may be configured to delay the wavelength of the external light by the first phase.

The first polarizer and the second polarizer may have polarization axes in a same direction.

The first and second phases may have same absolute values and different rotation directions, and when a location of the pattern retarder is adjusted to have the third retarder correspond to the second region of the transparent display device, the display apparatus may transmit the external light.

The first and second phases may have same absolute values and different rotation directions, and when a location of the pattern retarder is adjusted to have the second retarder correspond to the second region of the transparent display device, the display apparatus may block the external light.

The first polarizer and the second polarizer may have polarization axes perpendicular to each other.

The first and second phases may have same absolute values and different rotation directions, and when a location of the pattern retarder is adjusted to have the third retarder correspond to the second region of the transparent display device, the display apparatus may block the external light.

The first and second phases may have same absolute values and different rotation directions, and when a location of the pattern retarder is adjusted to have the second retarder correspond to the second region of the transparent display device, the display apparatus may transmit the external light.

The first and second regions of the transparent display device may be alternately arranged in a vertical direction, the second and third retarders of the pattern retarder corresponding to the first and second regions.

The display apparatus may further include a location changing unit configured to move the pattern retarder up or down by a half of a pixel pitch.

The first and second regions of the transparent display device may be alternately arranged in a horizontal direction, the second and third retarders of the pattern retarder corresponding to the first and second regions.

The display apparatus may further include a location changing unit configured to move the pattern retarder left or right by a half of a pixel pitch.

Slow axes of the second and third retarders may be perpendicular to each other.

A sum of a number of second retarders and a number of third retarders in the pattern retarder may be greater by one than twice a number of second regions in the transparent display device.

The number of second retarders may be different by one than the number of third retarders.

According to another aspect of the example embodiments, there is also provided a display apparatus capable of controlling light transmittance, the display apparatus including a transparent display device including first and second regions, the first region being configured to display images, the second region being configured to transmit external light therethrough, and the first and second regions being adjacent to each other and being alternately arranged in a first direction, a first circular polarizer in an optical path of light emitted by the transparent display device, the first circular polarizer being configured to delay and circularly polarize a wavelength of the external light by a first phase, and a second circular polarizer opposite to the optical path emitted by the transparent display device, the second circular polarizer including a first delay region for delaying the external light by the first phase and a second delay region for delaying the external light by a second phase, the first and second delay regions being alternately arranged in the first direction, and the second circular polarizer being configured to delay and circularly polarize the wavelength of the external light by the first phase or the second phase.

The first circular polarizer may include a first polarizer disposed on the optical path emitted by the transparent display device and linearly polarizing the external light, and a first retarder disposed between the first polarizer and the transparent display device to delay the wavelength of the external light by the first phase, and the second circular polarizer includes a second polarizer disposed opposite to the optical path emitted by the transparent display device to linearly polarize the external light, and a pattern retarder disposed between the second polarizer and the transparent display device, the pattern retarder including a second retarder delaying the wavelength of the external light by the first phase and a third retarder delaying the wavelength by the second phase, the second and third retarders being alternately arranged.

The first and second phases may have same absolute values and different rotation directions, the first circular polarizer and the second circular polarizer may have polarization axes in a same direction, and the display apparatus may further include a location changing unit for blocking or transmitting the external light by adjusting relative locations of the second circular polarizer and the transparent display device to have the first or second delay region of the second circular polarizer correspond to the second region of the transparent display device.

The first and second phases may have same absolute values and different rotation directions, the first circular polarizer and the second circular polarizer may have polarization axes perpendicular to each other, and the display apparatus may further include a location changing unit for blocking or transmitting the external light by adjusting relative locations of the second circular polarizer and the transparent display device to have the first or second delay region of the second circular polarizer correspond to the second region the transparent display device.

The first and second regions of the transparent display device may have patterns alternately repeating in a horizontal or vertical direction, and the first and second delay regions of the second circular polarizer may have patterns alternately repeating in a same direction as the first and second regions of the transparent display device.

According to yet another aspect of the example embodiments, there is also provided a display apparatus capable of controlling light transmittance, the display apparatus including a transparent display device including a first substrate with pixels and a second substrate sealing the first substrate, each pixel including first and second regions, the first region being configured to display images, the second region being configured to transmit external light therethrough, and the first and second regions being adjacent to each other and being alternately arranged in a first direction, a first linear polarizer on a first surface of the transparent display device, a first retarder between the first linear polarizer and the first surface of the transparent display device to delay the external light by a first phase, a second linear polarizer on a second surface of the transparent display device, the second surface being opposite the first surface, and a pattern retarder between the second polarizer and the second surface of the transparent display device, the pattern retarder including a second retarder for delaying a wavelength of the external light by a second phase and a third retarder for delaying the wavelength by a third phase, the second and third retarders being alternately and repeatedly arranged.

The first and second phases may be the same, and the first and third phases may have same absolute values and different rotation directions.

The first polarizer and the second polarizer may have polarization axes in a same direction, and the display apparatus may further include a location changing unit for blocking or transmitting the external light by adjusting relative locations of the pattern retarder and the transparent display device to have the second or third retarder correspond to the second region of the transparent display device.

The first polarizer and the second polarizer may have polarization axes perpendicular to each other, and the display apparatus may further include a location changing unit for blocking or transmitting the external light by adjusting relative locations of the pattern retarder and the transparent display device to have the second or third retarder correspond to the second region the transparent display device.

The first and second regions of the transparent display device may have patterns alternately repeated in a horizontal or vertical direction, and the second and third retarders of the pattern retarder may have patterns alternately arranged in a same direction as the first and second regions of the transparent display device.

The first retarder may be between the first substrate and the first polarizer, and the pattern retarder may be between the second substrate and the second polarizer.

The first retarder may be between the second substrate and the first polarizer, and the pattern retarder may be between the first substrate and the second polarizer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
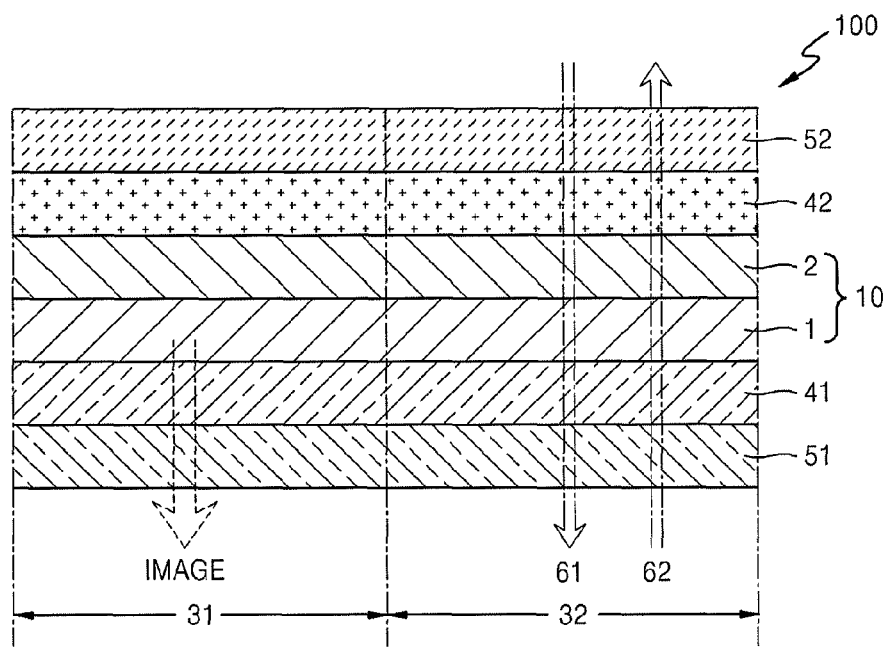
FIG. 1 illustrates a schematic cross-sectional view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

While such terms as "first", "second", etc., may be used to describe various components, such components must not be limited to the above terms. The above terms are used only to distinguish one component from another.

The terms used in the present specification are merely used to describe particular embodiments, and are not intended to limit the example embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In drawings, some layers or regions may be exaggerated for clarity. Also, it will be understood that when an element or a layer is referred to as being "on" another element or a layer, the element or layer can be directly on another element or layer or intervening elements or layers.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of a display apparatus 100 according to an embodiment. Referring to FIG. 1, the display apparatus 100 may include a first polarizer 51, a first retarder 41, a pattern retarder 42, and a second polarizer 52 on a transparent display device 10 through which external light penetrates.

Figure 6:
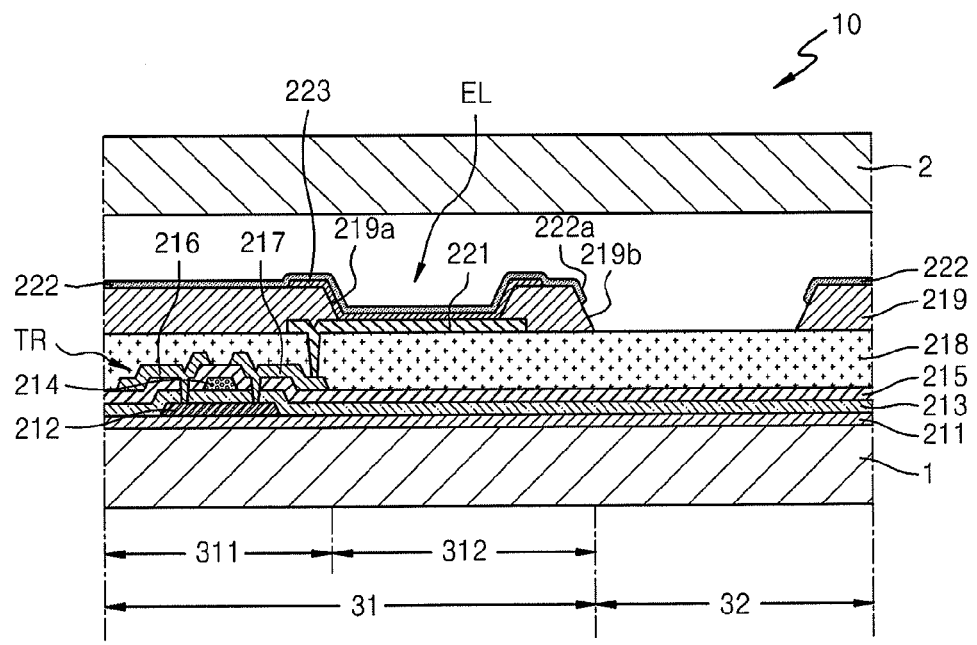
FIG. 6 illustrates a cross-sectional view of a sub-pixel in the transparent device of FIG. 1.

The transparent display device 10 is a bottom emission-type organic light-emitting display apparatus and may include a first substrate 1, a display unit disposed on the first substrate 1, and a second substrate 2 sealing the display unit. The display unit is divided into a plurality of pixels between the first and second substrates 1 and 2. For example, one pixel is illustrated in FIG. 6. Each pixel may include a pixel region 31 emitting light toward the first substrate 1, i.e., a region displaying a generated image, and a transmissive region 32 adjacent to the pixel region 31, i.e., a region through which external light penetrates.

Figure 2:
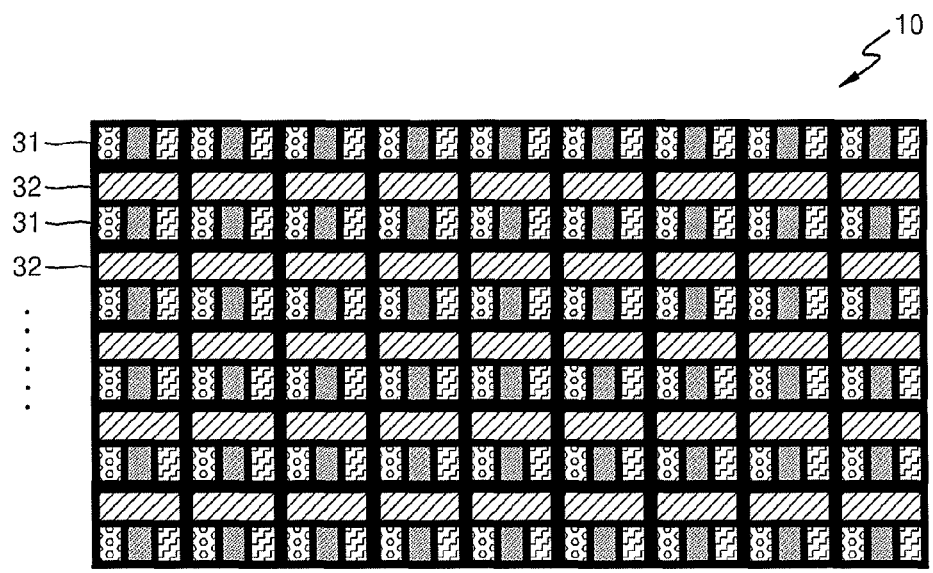
FIG. 2 illustrates a schematic plane view of a transparent display device of FIG. 1.

FIG. 2 is a schematic plan view of the transparent display device 10 of FIG. 1. As shown in FIG. 2, the display unit of the transparent display device 10 may include a plurality of pixels that are arranged in a matrix shape in row and column directions. Here, the pixels are arranged such that the pixel region 31 and the transmissive region 32 of the transparent display device 10 have a pattern that alternately repeats in one direction. For example, sub pixels may be arranged horizontally to define horizontal lines spaced apart from each other vertically, i.e., lines of the pixel regions 31, so each transmissive region 32 may be between two pixel regions 31 to define an alternating pattern. Accordingly, the pixel region 31 and the transmissive region 32 are regularly formed at regular intervals in one direction in the transparent display device 10.

Referring back to FIG. 1, the first retarder 41 and the first polarizer 51 are sequentially disposed outside the first substrate 1, e.g., the first substrate 1 may be between the second substrate 2 and the first retarder 41, so light generated in or transmitted through the transparent display device 10 is emitted toward and passes through the first retarder 41 and the first polarizer 51. Light passing through the first polarizer 51 and the first retarder 41 is circularly polarized in a predetermined direction. In other words, when the first polarizer 51 and the first retarder 41 are stacked, i.e., directly disposed on top of each other, only left circularly polarized light or only right circularly polarized light passes through the combined first polarizer 51 and first retarder 41, thereby enabling a user to clearly view an image by reducing reflection of the external light on an entire surface of the display apparatus 100. Here, the first polarizer 51 is a linear polarizer that linearly polarizes incident light in a predetermined direction, and the first retarder 41 is a retarder that delays a phase of an incident light by (+1/4) wavelength (+λ/4). The first retarder 41 converts linearly polarized light from into a circularly polarized light, or converts a circularly polarized light to a linearly polarized light. The first retarder 41 may be adhered to the transparent display device 10 via an adhesive material, or may be adhered to the transparent display device 10 in a film shape.

The pattern retarder 42 and the second polarizer 52 are sequentially disposed outside the second substrate 2, e.g., the second substrate 2 may be between the first substrate 1 and the pattern retarder 42. Here, the second polarizer 52 is a linear polarizer that linearly polarizes incident light in a predetermined direction. The pattern retarder 42 is a switchable retarder including a second retarder 421 that delays a phase of an incident light by (−1/4) wavelength (−λ/4), and a third retarder 422 that delays a phase of an incident light by (+1/4) wavelength (+λ/4). The pattern retarder 42 converts linearly polarized light into circularly polarized light, or converts circularly polarized light to linearly polarized light.

Figure 3:
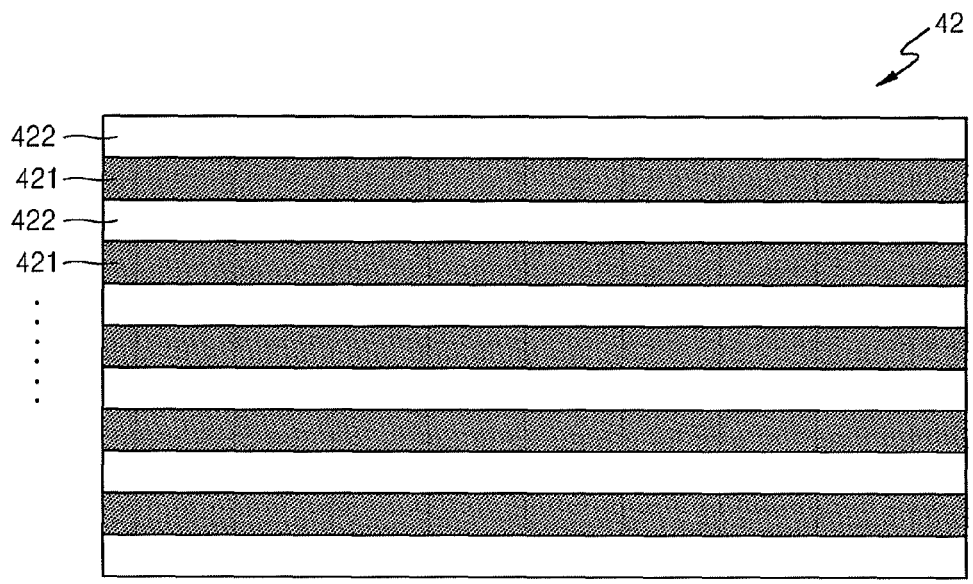
FIG. 3 illustrates a schematic plane view of a pattern retarder of FIG. 1.

FIG. 3 is a schematic view of the pattern retarder 42 of FIG. 1. As shown in FIG. 3, the pattern retarder 42 may include repeatedly alternating second retarders 421 and third retarders 422. The alternating pattern of the second and third retarders 421 and 422 may be in a same direction as the repeated pattern direction of the pixel regions 31 and the transmissive regions 32 of the transparent display device 10. For example, the second and third retarders 421 and 422 may alternate along the vertical direction (FIG. 3), while the pixel and transmissive regions 31 and 32 may alternate along the vertical direction as well (FIG. 2). Accordingly, in the current embodiment, transmittance of external light may be controlled by adjusting a relative location of the pattern retarder 42 in the transparent display device 10, e.g., the pattern retarder 42 may be adjusted to have the second or third retarder 421 or 422 correspond to a periodic transmissive region 32 of the transparent display device 10. For example, the pattern retarder 42 may be adjusted to have either the second retarders 421 or the third retarders 422 overlap respective transmissive regions 32 of the transparent display device 10, thereby controlling light transmittance.

A sum of a number of the second retarders 421 and a number of the third retarders 422 in the pattern retarder 42 may be greater by one than twice a number of lines of the transmissive regions 32 of the transparent display device 10. Here, according to a location control method of the pattern retarder 42, the number of the second retarders 421 may be greater by one than the number of the third retarders 422, or the number of the third retarders 422 may be greater by one than the number of the second retarders 421. For example, referring to the transparent display device 10 and the pattern retarder 42 shown in FIGS. 2 and 3, the transparent display device 10 may include five lines of transmissive regions 32 (FIG. 2) and the pattern retarder 42 may include five second retarders 421 and six third retarders 422 (FIG. 3), i.e., eleven retarders total. However, the number of pixels and retarders shown in FIGS. 2 and 3 is for convenience of description, and is not limited thereto.

The pattern retarder 42 may have a structure including an alignment film and a liquid crystal film. The alignment film aligns liquid crystal molecules of the liquid crystal film, and may be formed of any suitable photo-alignment compound. The liquid crystal molecules of the liquid crystal film are aligned according to an alignment of the alignment film. The pattern retarder 42 having a periodically changing phase delay value may be formed by changing an alignment state of the liquid crystal molecules by varying an alignment process of the alignment film at regions where the second or third retarders 421 or 422 are located. The second and third retarders 421 and 422 may have slow axes that are perpendicular to each other.

According to an embodiment, the first polarizer 51 and the second polarizer 52 may have the same polarization axes or different polarization axes. In either case, the display apparatus 100 is capable of converting the transmittance of the external light with low power via phase delay value control of the pattern retarder 42. An embodiment provides the display apparatus 100 with various optical elements, i.e., the first polarizer 51, the first retarder 41, the pattern retarder 42, and the second polarizer 52, so transmittance of the external light may be adjusted by using the various optical elements.

In detail, as a method of adjusting transmittance of external light, conventionally, a liquid crystal may be disposed on one side of the transparent display device 10 In this case, two glass substrates may be required to seal the liquid crystal. However, according to an example embodiment, glass substrates and a liquid crystal may not be required due to a specific arrangement of the pattern retarder 42 and the various optical elements, so transmittance of the display apparatus 100 may be adjusted with low power.

Also, since a wavelength dispersion of a liquid crystal, e.g., the pattern retarder 42, is different from a wavelength dispersion of an optical element, e.g., the first retarder 41, it may be difficult to match the wavelength dispersion of the liquid crystal and the optical element, e.g., the first retarder 41 and the pattern retarder 42, in a conventional display apparatus that exhibits a wavelength dispersion characteristic. Here, a wavelength dispersion denotes a phenomenon where light of all wavelengths does not turn into a uniform black state or into a uniform transparent state. However, according to an example embodiment, since a solid type pattern retarder 42 is used, i.e., a retarder with a plurality of repeatedly arranged retarders having different phase delay, it may be easier to match wavelength dispersions between the first retarder 41 and the pattern retarder 42. Accordingly, as wavelength dispersion between the first retarder 41 and the pattern retarder 42 is matched, transmittance of external light may be increased when the display apparatus 100 is in a transparent mode, and may be decreased when the display apparatus 100 is in a black mode.

In addition, adjusting transmittance of external light using the liquid crystal may conventionally require a liquid crystal sealing process and a transparent display device manufacturing process that are not performed separately, thereby providing a complex overall manufacturing process. Furthermore, transmittance of external light may be conventionally adjusted by adjusting an arrangement of the liquid crystal via an electrical method, thereby increasing process complexity. However, according to an example embodiment, as manufacturing processes of the transparent display device 10 and the solid type pattern retarder 42 may be performed separately, the overall manufacturing processes may be simplified. In addition, according to an example embodiment, transmittance of external light may be simply adjusted by changing location of the pattern retarder 42, e.g., relative to the transmissive regions 32, via a mechanical/physical method.

For example, according to an embodiment, when the display apparatus 100 is in a transparent mode of light penetration, a user at a first side, i.e., where an image is realized, may view an image at an opposite side of the display device, i.e., outside the second substrate 2, through a first external light 61 that penetrates from outside the second substrate 2 through the second substrate 2 and the first substrate 1 to the first side. On the other hand, a user at the second side may view an image at the first side of the display through a second external light 62 that penetrates from the first side through the first and second substrates 1 and 2 to the second side. Here, the first external light 61 is an external light emitted in a same direction as an image, and the second external light 62 is an external light emitted in an opposite direction of the first external light 61. Alternatively, when the display apparatus 100 is in a black mode of no light penetration, the user at the first side is unable to view an image outside the second substrate 2, and the user at the second side is unable to view the image outside the first substrate 1.

Figure 4:
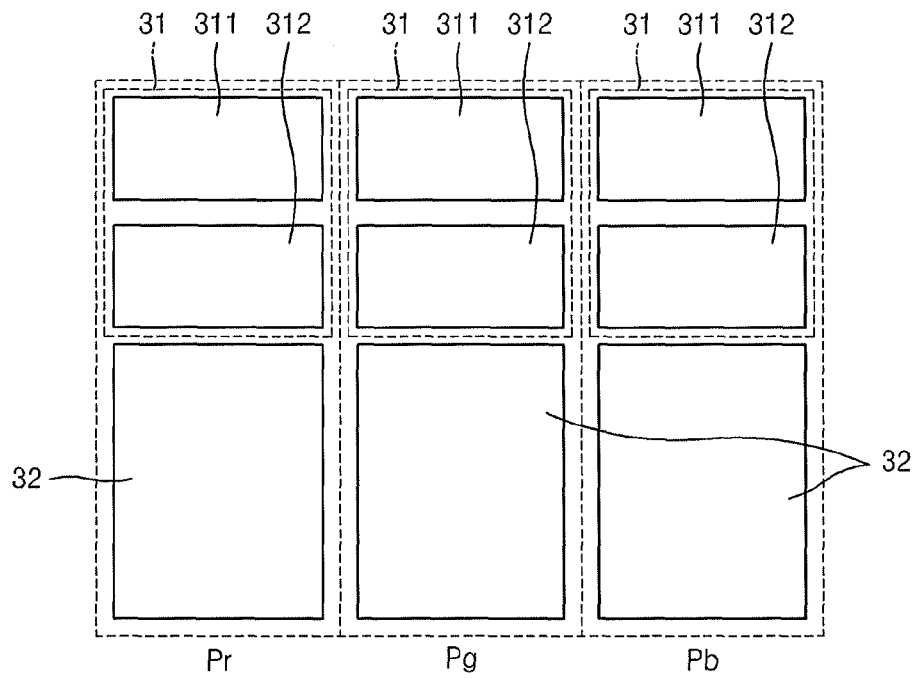
FIGS. 4 and 5 illustrate diagrams of pixels in the transparent display device of FIG. 1.
Figure 5:
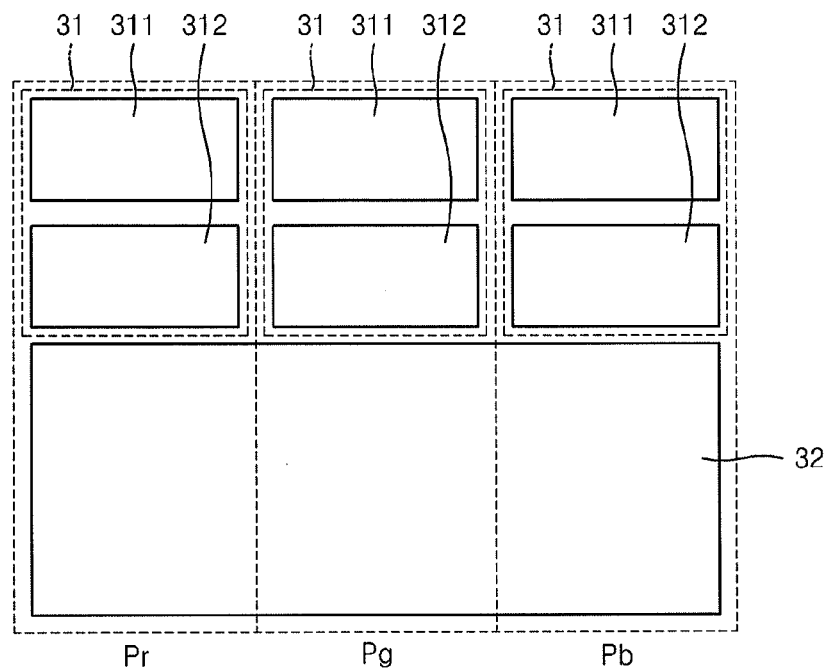

FIG. 4 is a diagram of a pixel included in the transparent display device 10 of FIG. 1, according to an embodiment, and FIG. 5 is a diagram of a pixel according to another embodiment.

Referring to FIGS. 4-5, the pixel may include a plurality of sub-pixels, e.g., a red sub-pixel Pr, a green sub-pixel Pg, and a blue sub-pixel Pb. Each of the red, green, and blue sub-pixels Pr, Pg, and Pb may include a pixel region 31 and a transmissive region 32. The pixel region 31 may include a pixel circuit unit 311 and an emissive unit 312 that are adjacently disposed not to overlap with each other. Accordingly, when the emissive unit 312 emits light toward the first substrate 1, the pixel circuit unit 311 does not interfere with the light.

The transmissive region 32 through which the external light penetrates is adjacent to the pixel region 31. For example, respective transmissive regions 32 may be independently disposed, e.g., to be separated from each other, according to the red, green, and blue sub-pixels Pr, Pg, and Pb, as shown in FIG. 4. In another example, respective transmissive regions 32 may be connected to each other throughout the red, green, and blue sub-pixels Pr, Pg, and Pb, as shown in FIG. 5. In other words, the pixel may include the plurality of pixel regions 31 spaced apart from each other along common transmissive regions 32 throughout the display unit. According to the embodiment of FIG. 5, the area of the transmissive region 32 through which the external light penetrate is increased, so transmittance of the entire display unit may be increased. It is noted that while FIG. 5 illustrates that all the transmissive regions 32 of the red, green, and blue sub-pixels Pr, Pg, and Pb are connected to each other, the transmissive regions 32 of any two adjacent sub-pixels from among the red, green, and blue sub-pixels Pr, Pg, and Pb may be connected to each other.

FIG. 6 is a cross-sectional view of any one of red, green, and blue sub-pixels Pr, Pg, and Pb of FIGS. 4 and 5. As shown in FIG. 6, a thin film transistor TR is disposed on the pixel circuit unit 311 of the pixel region 31. However, example embodiments are not limited thereto, e.g., a pixel circuit including the thin film transistor TR may be disposed. The pixel circuit may further include a plurality of thin film transistors and a storage capacitor, in addition to the thin film transistor TR, and may also further include wires, e.g., a scan line, a data line, and a Vdd line, connected thereto.

An organic light-emitting device EL constituting a light-emitting device may be disposed on the emissive unit 312 of the pixel region 31. The organic light-emitting device EL is electrically connected to the thin film transistor TR of the pixel circuit.

First, a buffer film 211 may be formed on the first substrate 1, and the pixel circuit including the thin film transistor TR may be formed on the buffer film 211. Then, a semiconductor active layer 212 may be formed on the buffer film 211.

The buffer film 211 prevents penetration of impure elements and levels a surface of the first substrate 1, and may be formed of any one of various materials performing such functions. For example, the buffer film 211 may be formed of an inorganic material, e.g., silicon oxide, silicon nitride, silicon oxynitride, aluminum oxide, aluminum nitride, titanium oxide, or titanium nitride, an organic material, e.g., polyimide, polyester, or acryl, or a stacked structure thereof. The buffer film 211 is not an essential element, and may not be included as occasion demands.

The semiconductor active layer 212 may be formed of, e.g., polycrystalline silicon, an oxide semiconductor, etc. For example, the semiconductor active layer 212 may be a $(In_2O_3)a(Ga_2O_3)b(ZnO)c$ layer (G-I—Z—O layer), wherein a, b, and c are respectively a real number satisfying $a \geq 0$, $b \geq 0$, and $c > 0$. When the semiconductor active layer 212 is formed of such an oxide semiconductor, light transmittance of the pixel circuit unit 311 in the pixel region 31 may be further increased, thereby increasing transmittance of the external light of the entire display unit.

A gate insulation film 213 may be formed on the buffer film 211 to cover the semiconductor active layer 212, and a gate electrode 214 may be formed on the gate insulation film 213. An interlayer insulation film 215 may be formed on the gate insulation film 213 to cover the gate electrode 214, and a source electrode 216 and a drain electrode 217 may be formed on the interlayer insulation film 215 to each contact the semiconductor active layer 212 through a contact hole. The structure of the thin film transistor TR is not limited to the one above, and any suitable structure may be applied to the thin film transistor TR.

A passivation film 218 may be formed to cover the thin film transistor TR. The passivation film 218 may be a single insulation film or a plurality of insulation films having a leveled top surface. The passivation film 218 may be formed of an inorganic material and/or an organic material. The passivation film 218 may be formed to cover both the pixel region 31 and the transmissive region 32. However, the passivation film 218 may include an opening (not shown) at a location corresponding to the transmissive region 32 so as to further improve transmittance of the external light in the transmissive region 32.

A first electrode 221 of the organic light-emitting device EL that is electrically connected to the thin film transistor TR may be formed on the passivation film 218. The first electrode 221 may be formed in an independent island shape in each of all sub-pixels. The first electrode 221 may be located in the emissive unit 312 of the pixel region 31 and may be disposed to not overlap with the pixel circuit unit 311.

A pixel-defining film 219 formed of an organic and/or inorganic insulation material may be formed on the passivation film 218. The pixel-defining film 219 may include a third opening 219a covering an edge and exposing a center of the first electrode 221. The pixel-defining film 219 may cover the pixel region 31, e.g., the pixel-defining film 219 may at least cover the edge of the first electrode 221 instead of covering the entire pixel region 31. The pixel-defining film 219 may include a second opening 219b at a location corresponding to the transmissive region 32, so transmittance of external light in the transmissive region 32 may be further increased.

Both the passivation film 218 and the pixel-defining film 219 may include a transparent material. When an insulation film includes a transparent material, transmittance of external light in the transparent display device 10 may be further increased.

An organic film 223 and a second electrode 222 may be sequentially stacked on the first electrode 221 exposed through the third opening 219a. The second electrode 222 covers the organic film 223 and the pixel-defining film 219 by facing the first electrode 221. The second electrode 222 is located in the pixel region 31, e.g., the second electrode 222 is formed at least in the pixel region 31, and may include a first opening 222a at a location corresponding to the transmissive region 32. Since the second electrode 222 is not located in the transmissive region 32, transmittance of external light in the transmissive region 32 may be further increased. The first and second openings 222a and 219b may be connected to each other.

A low molecular or polymer organic film may be used as the organic film 223. When the low molecular organic film is used, a hole injection layer (HIL), a hole transport layer (HTL), an emission layer (EML), an electron transport layer (ETL), and an electron injection layer (EIL) may be stacked in a single or complex structure, and any suitable organic material, e.g., copper phthalocyanine (CuPc), N,N'-Di(naphthalene-1-yl)-N,N'-diphenyl-benzidine (NPB), and tris-8-hydroxy quinoline aluminum) (Alq3), may be used. The low molecular organic film may be formed by using a vacuum deposition method. Here, the HIL, the HTL, the ETL, and the EIL are common layers, and may be commonly applied to red, green, and blue sub-pixels.

In a case where the organic light-emitting device EL is a full-color organic light-emitting device, the EML may be patterned to a red EML, a green EML, and a blue EML, according to a red sub-pixel, a green sub-pixel, and a blue sub-pixel, respectively. Here, a styryl-based compound or a compound containing styryl-based composition may be included as a blue phosphor dopant in the blue EML. The EML may have a multi-stack structure in which the red EML, the green EML, and the blue EML are stacked or may have a single-layer structure including a red emission material, a green emission material, and a blue emission material. The organic light-emitting device EL including the EML may emit a full-color by additionally including a red color filter, a green color filter, and a blue color filter.

The first electrode 221 functions as an anode and the second electrode 222 functions as a cathode, or vice versa. According to an embodiment, the first electrode 221 may be a transparent electrode, and the second electrode 222 may be a reflective electrode. The first electrode 221 may include a transparent conductive material, e.g., indium tin oxide (ITO), indium zinc oxide (IZO), zinc oxide (ZnO), or indium oxide (In2O3). Also, the second electrode 222 may be formed of, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Accordingly, the organic light-emitting device EL is a bottom emission-type realizing an image in a direction of the first electrode 221. In this case, the second electrode 222 may have a sufficient thickness such that a voltage drop is not generated throughout the display unit. Thus, the second electrode 222 may be sufficiently applied to the display apparatus 100 having a large area.

Figure 7:
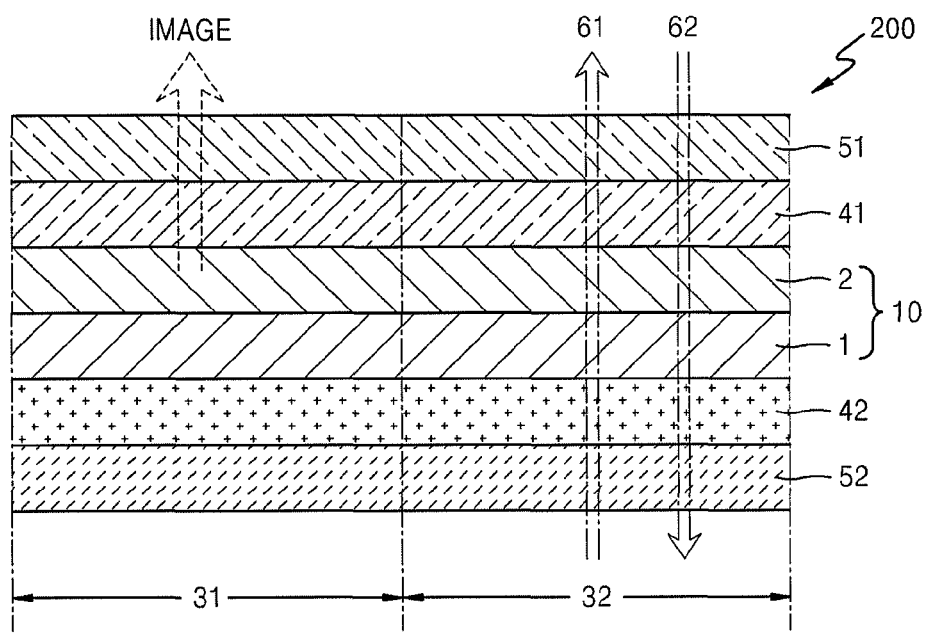
FIG. 7 illustrates a schematic cross-sectional view of a display apparatus according to another embodiment.

FIG. 7 is a cross-sectional view schematically illustrating a display apparatus 200 according to another embodiment. Unlike the display apparatus 100 shown in FIG. 1, the display apparatus 200 of FIG. 7 includes a transparent display device that is a top emission-type organic light-emitting display apparatus.

Accordingly, as illustrated in FIG. 7, the first retarder 41 and the first polarizer 51 are disposed outside the second substrate 2 that emits light, i.e., a generated image, from the transparent display device 10. The pattern retarder 42 and the second polarizer 52 are disposed outside the first substrate 1 that does not emit light sequentially, i.e., does not emit a generated image, from the transparent display device 10. Since functions of other elements are substantially the same to those shown in FIGS. 1 through 3, descriptions thereof are not provided.

According to an embodiment, when the display apparatus 200 is in a transparent mode of light penetration, the user at the side where an image is realized may view an image outside the first substrate 1 through the first external light 61 that penetrates from outside the first substrate 1 to outside the second substrate 2. On the other hand, the user at the side opposite to the side where an image is realized may also view an image outside the second substrate 2 through the second external light 62 that penetrates from outside the second substrate 2 to outside first substrate 1. Here, the first external light 61 is an external light emitted in the same direction as an image, and the second external light 62 is an external light emitted in an opposite direction of the first external light 61. Alternatively, when the display apparatus 200 is in a black mode of no light penetration, the user at the side where an image is realized is unable to view an image outside the first substrate 1. Also, the user at the side opposite to the side where the image is realized is also unable to view the image outside the second substrate 2.

Figure 8:
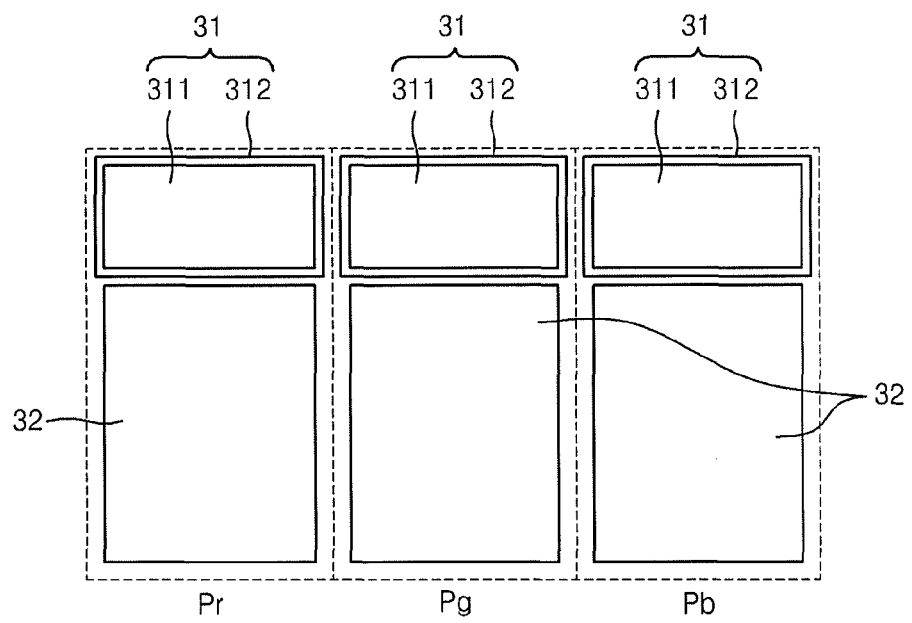
FIGS. 8 and 9 illustrate diagrams of pixels included in a transparent display device of FIG. 7.
Figure 9:
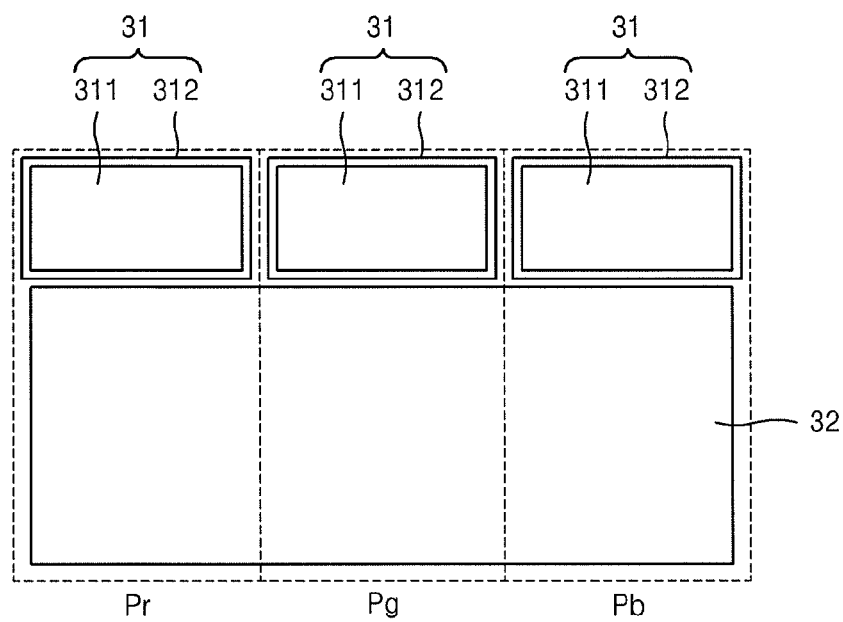

FIG. 8 is a diagram of a pixel included in the transparent display device 10 of FIG. 7, according to an embodiment of the example embodiments, and FIG. 9 is a diagram of a pixel according to another embodiment of the example embodiments.

Unlike the pixels shown in FIGS. 4 and 5, the pixels shown in FIGS. 8 and 9 are disposed such that the pixel circuit unit 311 and the emissive unit 312 included in the pixel region 31 overlap each other. Since the emissive unit 312 emits light in the direction of the second substrate 2, the pixel circuit unit 311 and the emissive unit 312 may overlap with each other. In addition, as the emissive unit 312 covers the pixel circuit unit 311 including the pixel circuit, optical interference by the pixel circuit may be prevented. Since functions of other elements are substantially the same to those of FIGS. 4 and 5, descriptions thereof are not provided. The transmissive regions 32 may be independently included according to the red, green, and blue sub-pixels Pr, Pg, and Pb, as shown in FIG. 8, or may be connected to each other throughout the red, green, and blue sub-pixels Pr, Pg, and Pb, as shown in FIG. 9.

Figure 10:
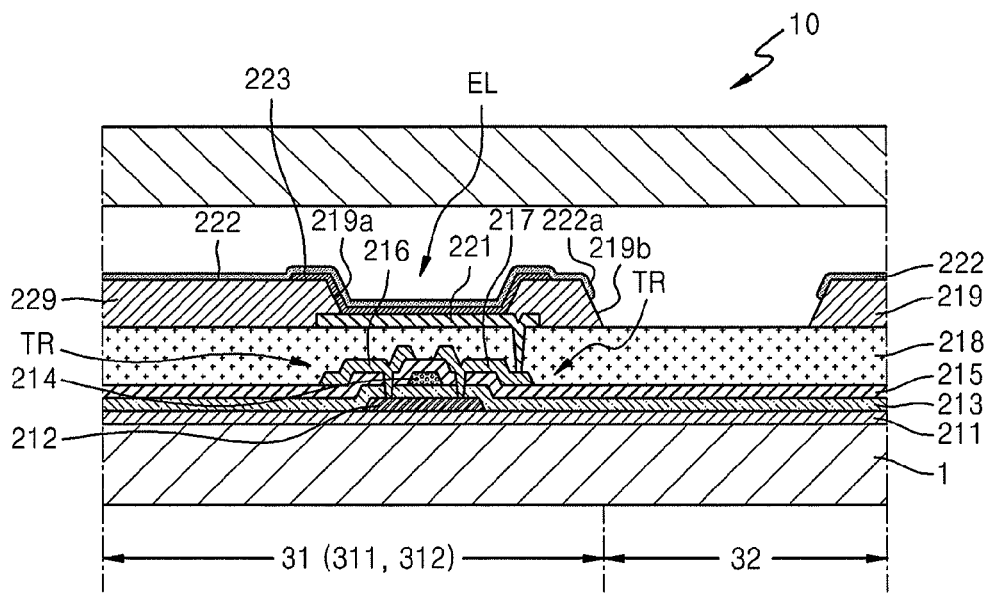
FIG. 10 illustrates a cross-sectional view of a sub-pixel in FIGS. 8 and 9.

FIG. 10 is a cross-sectional view of any one of the red, green, and blue sub-pixels Pr, Pg, and Pb of FIGS. 8 and 9. As shown in FIG. 10, the thin film transistor TR is disposed in the pixel circuit unit 311, and the organic light-emitting device EL is disposed in the emissive unit 312.

The buffer film 211 may be formed on the first substrate 1, the semiconductor active layer 212 may be formed on the buffer film 211, and the gate insulation film 213, the gate electrode 214, and the interlayer insulation film 215 may be formed on the semiconductor active layer 212. The source and drain electrodes 216 and 217 may be formed on the interlayer insulation film 215. The passivation film 218, i.e., a type of insulation film, may be formed to cover the thin film transistor TR. The passivation film 218 may be formed to cover both the pixel region 31 and the transmissive region 32. However, alternatively, the passivation film 218 may include an opening (not shown) at a location corresponding to the transmissive region 32, thereby further increasing transmittance of external light through the transmissive region 32.

The first electrode 221 of the organic light-emitting device EL that is electrically connected to the thin film transistor TR may be formed on the passivation film 218. The first electrode 221 may be located at the emissive unit 312 in the pixel region 31 and may be disposed to cover the pixel circuit unit 311 by overlapping with the pixel circuit unit 311.

The pixel-defining film 219 formed of an organic and/or inorganic insulation material may be formed on the passivation film 218. The pixel-defining film 219 may include the third opening 219a that covers the edge and exposes the center of the first electrode 221. The pixel-defining film 219 may cover the pixel region 31, but instead of covering the entire pixel region 31, the pixel-defining film 219 may at least cover the edge of the first electrode 221. The pixel-defining film 219 may include the second opening 219b at a location corresponding to the transmissive region 32. The pixel-defining film 219 may not be located in the transmissive region 32, so the transmittance of the external light in the transmissive region 32 may be further increased.

Both the passivation film 218 and the pixel-defining film 219 may include a transparent material. When an insulation film includes a transparent material, transmittance of external light through the transparent display device 10 may be further increased.

The organic film 223 and the second electrode 222 may be sequentially stacked on the first electrode 221 exposed through the third opening 219a. The second electrode 222 may be formed at least in the pixel region 31, and may include the first opening 222a at a location corresponding to the transmissive region 32. Since the second electrode 222 is not located in the transmissive region 32, transmittance of external light in the transmissive region 32 may be further increased. The first and second openings 222a and 219b may be connected to each other.

According to an embodiment shown in FIG. 10, the first electrode 221 may have a stacked structure of a transparent conductive material and a reflective film, and the second electrode 222 may be an anti-reflective and anti-transmissive electrode. Here, the transparent conductive material may be, e.g., ITO, IZO, ZnO, or $In_2O_3$, which has a high work function. Also, the reflective film may include at least one metal of, e.g., Ag, MgAl, Pt, Pd, Au, Ni, Nd Ir, Cr, Li, Ca, Mo, and alloys thereof. Here, the first electrode 221 may be formed in the pixel region 31.

The second electrode 222 may be formed of, e.g., Ag, Mg, Al, Pt, Pd, Au, Ni, Nd, Ir, Cr, Li, Ca, Mo, or an alloy thereof. Here, the second electrode 222 may be a thin film having a thickness from about 100 Å to about 300 Å for high transmittance. Accordingly, the organic light-emitting device EL is a top emission-type device that realizes an image in the direction of the second electrode 222.

Figure 11:
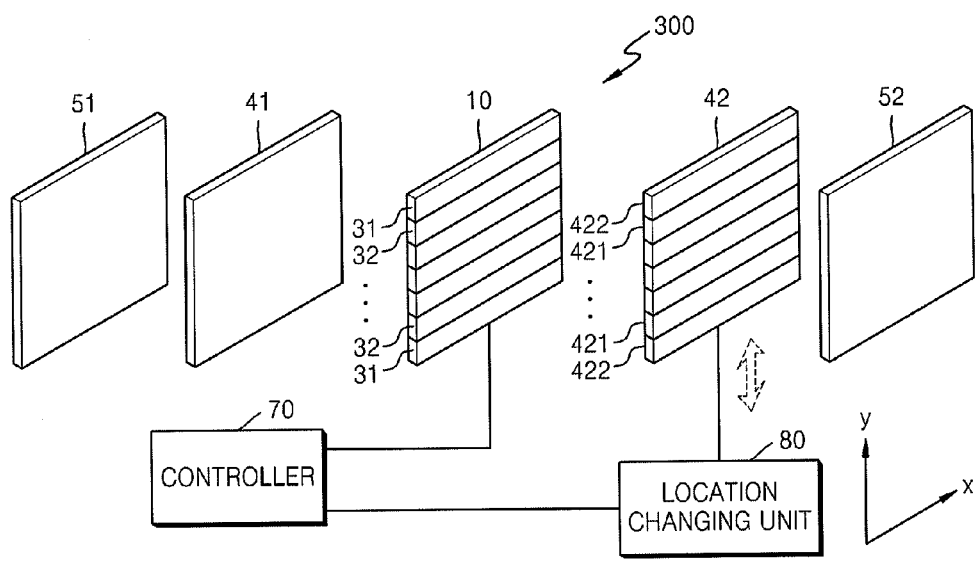
FIG. 11 illustrates a schematic diagram of an operation of a display apparatus according to an embodiment.

FIG. 11 is a diagram for schematically describing an operation of a display apparatus 300, according to an embodiment.

Referring to FIG. 11, the display apparatus 300 may be an electronic apparatus for processing and displaying an image, e.g., a tablet computer, a media storage apparatus, a mobile phone, or a personal portable terminal. The display apparatus 300 may include the first polarizer 51, the first retarder 41, the transparent display device 10, the pattern retarder 42, and the second polarizer 52. The display apparatus 300 shown in FIG. 11 may be the display apparatus 100 or 200 shown in FIG. 1 or 7. The display apparatus 300 may further include a controller 70 and a location changing unit 80. Hereinafter, descriptions about elements corresponding to those of FIGS. 1 and 7 are not provided.

As described previously, and as illustrated in FIG. 11, the transparent display device 10 may have a pattern in which the pixel region 31 and the transmissive region 32 are repeatedly and alternately arranged in a column direction (y-axis). As further illustrated in FIG. 11, the pattern retarder 42 may have a pattern in which the second retarder 421 and the third retarder 422 are repeatedly arranged in the column direction according to the pixel region 31 and the transmissive region 32 of the transparent display device 10, e.g., the pixel regions 31 overlap the third retarders 422 and the transmissive regions 32 overlap the second retarders 421.

The controller 70 may include a driver integrated circuit (IC) (not shown) for driving the transparent display device 10. The driver IC may include a scan driver applying scan signals to a plurality of scan lines S, and a data driver applying data signals to a plurality of data lines D. The scan and data lines S and D may be formed on the display unit of the transparent display device 10. Also, the controller 70 may output a control signal for controlling the transmittance of the external light to the location changing unit 80.

The location changing unit 80 mechanically, e.g., physically, moves the pattern retarder 42 by a predetermined distance along the y-axis according to the control signal, thereby changing a relative location of the second and third retarders 421 and 422 with respect to the transparent display device 10. For example, the location changing unit 80 may move the pattern retarder 42 up and down in the vertical direction (y-axis) so as to control the transmittance of the external light penetrating through the transparent display device 10. A location variation (moved distance) of the pattern retarder 42 approximately corresponds to a half (½) of a pixel pitch. For example, the location variation of the pattern retarder 42 may be about 200 μm.

Figure 12A:
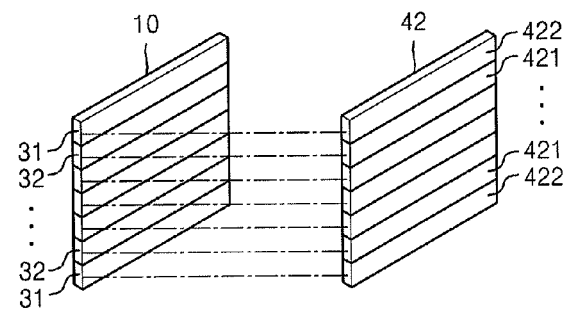
FIGS. 12A through 12C illustrate diagrams of a relative location change of a transparent display device and a pattern retarder of FIG. 11.
Figure 12B:
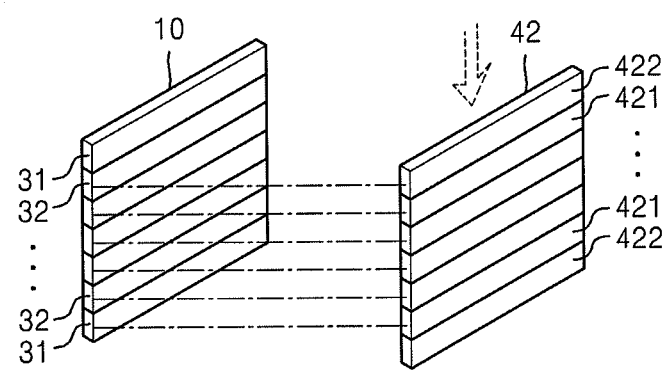
Figure 12C:
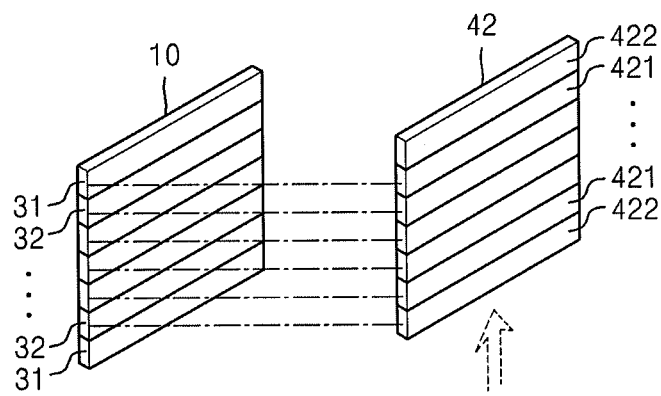

FIGS. 12A through 12C are diagrams for describing a relative location change of the transparent display device 10 and the pattern retarder 42 of FIG. 11. Alternate long and short chain lines of FIGS. 12A through 12C are illustrated to describe a location correspondence relationship of the transparent display device 10 and the pattern retarder 42.

As shown in FIG. 12A, initially, the pattern retarder 42 may be arranged to have the third retarder 422, i.e., which delays a phase of an incident light by (+λ/4), disposed according to the pixel region 31 of the transparent display device 10, and the second retarder 421, which delays the phase of the incident light by (−λ/4), disposed according to the transmissive region 32 of the transparent display device 10. The display apparatus 300 controls the up-and-down movement of the pattern retarder 42 in the vertical direction (y-axis) by using the location changing unit 80 to change relative locations of the transparent display device 10 and the pattern retarder 42, thereby controlling the transmittance of the external light.

That is, the pattern retarder 42 may be moved down by a predetermined distance as shown in FIG. 12B, or may be moved up by a predetermined distance as shown in FIG. 12C, such that the second retarder 421 delaying the phase of the incident light of the pattern retarder 42 by (−λ/4) may be disposed to correspond to the pixel region 31 of the transparent display device 10, and the third retarder 422 delaying the phase of the incident light by (+λ/4) may be disposed to correspond to the transmissive region 32 of the transparent display device 10.

However, embodiments are not limited thereto. For example, initially, the second retarder 421 delaying the phase of the incident light by (−λ/4) may be disposed to correspond to the pixel region 31 of the transparent display device 10, and the third retarder 422 delaying the phase of the incident light by (+λ/4) may be disposed to correspond to the transmissive region 32 of the transparent display device 10. Then, the pattern retarder 42 may be moved up or down by a predetermined distance to adjust the third retarder 422 to correspond to the pixel region 31 of the transparent display device 10, and the second retarder 421d to correspond to the transmissive region 32 of the transparent display device 10.

Figure 13:
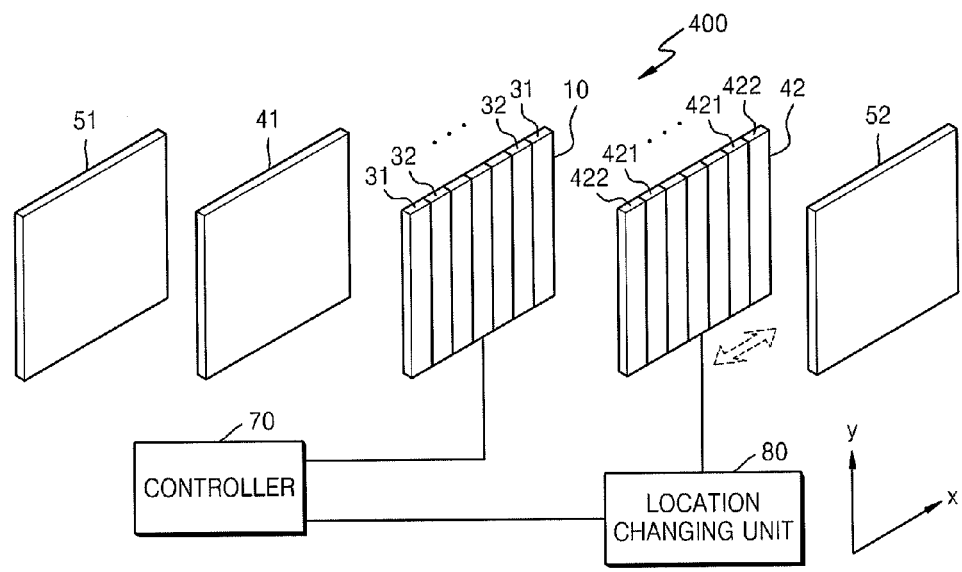
FIG. 13 illustrates a schematic diagram of an operation of a display apparatus according to another embodiment.

FIG. 13 is a diagram for schematically describing an operation of a display apparatus 400, according to another embodiment. Unlike the display apparatus 300 of FIG. 11, the display apparatus 400 of FIG. 13 includes the transparent display device 10 with the pixel region 31 and the transmissive region 32 repeatedly arranged in a row direction (x-axis). Therefore, the pattern retarder 42 has a pattern in which the second retarder 421 and the third retarder 422 are repeatedly arranged in the row direction according to the pixel region 31 and the transmissive region 32 of the transparent display device 10. Accordingly, the location changing unit 80 moves the pattern retarder 42 left and right in a horizontal direction (x-axis) according to a control signal output by the controller 70, thereby controlling the transmittance of the external light penetrating through the transparent display device 10. The location variation (moved distance) of the pattern retarder 42 approximately corresponds to a half (½) of a pixel pitch. Since functions of other elements are substantially the same to those of FIG. 11, descriptions thereof are not provided.

Figure 14A:
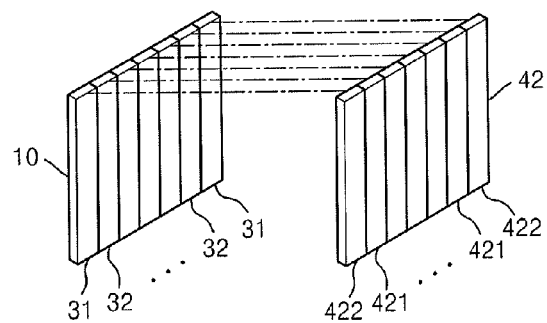
FIGS. 14A through 14C illustrates diagrams of a relative location change of a transparent display device and a pattern retarder of FIG. 13.
Figure 14B:
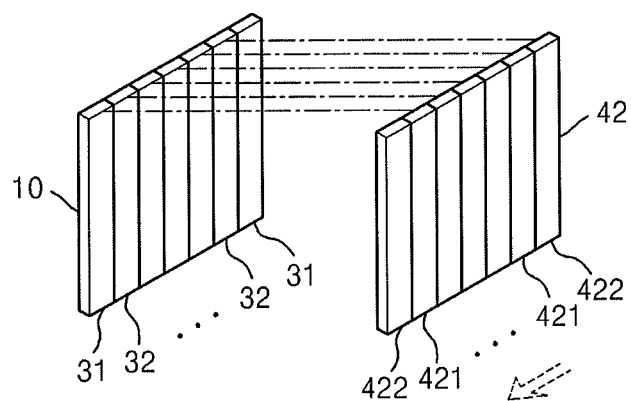
Figure 14C:
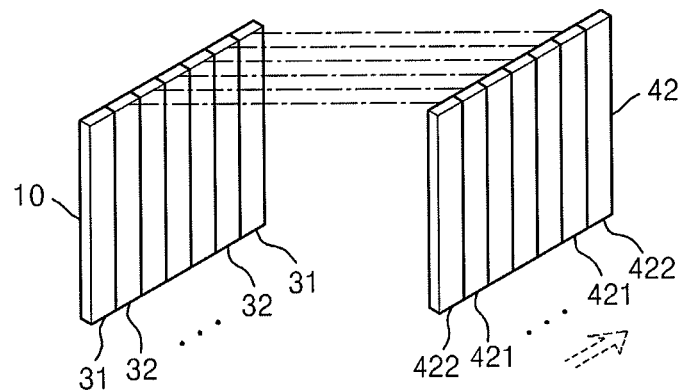

FIGS. 14A through 14C are diagrams for describing a relative location change of the transparent display device 10 and the pattern retarder 42 of FIG. 13. Alternate long and short chain lines of FIGS. 14A through 14C are illustrated to describe a location correspondence relationship of the transparent display device 10 and the pattern retarder 42.

As shown in FIG. 14A, initially, the pattern retarder 42 is arranged to have the third retarder 422, i.e., which delays the phase of the incident light by (+λ/4), correspond to the pixel region 31 of the transparent display device 10, and the second retarder 421, i.e., which delays the phase of the incident light by (−λ/4), correspond to the transmissive region 32 of the transparent display device 10. The display apparatus 400 may move the pattern retarder 42 left by a predetermined distance, as shown in FIG. 14B, or right by a predetermined distance, as shown in FIG. 14C, by using the location changing unit 80. As such, the horizontal movement of the pattern retarder 42 sets the second retarder 421 to correspond to the pixel region 31 of the transparent display device 10, and the third retarder 422 to correspond to the transmissive region 32 of the transparent display device 10.

However, embodiments are not limited thereto. For example, in the initial pattern retarder 42, the second retarder 421 delaying the phase of the incident light by (−λ/4) may be disposed to correspond to the pixel region 31 of the transparent display device 10, and the third retarder 422 delaying the phase of the incident light by (+λ/4) may be disposed to correspond to the transmissive region 32 of the transparent display device 10. Then, the pattern retarder 42 may be moved left or right by a predetermined distance such that the third retarder 422 delaying the phase of the incident light by (+λ/4) may be disposed to correspond to the pixel region 31 of the transparent display device 10, and the second retarder 421 delaying the phase of the incident light by (−λ/4) may be disposed to correspond to the transmissive region 32 of the transparent display device 10.

Figure 15:
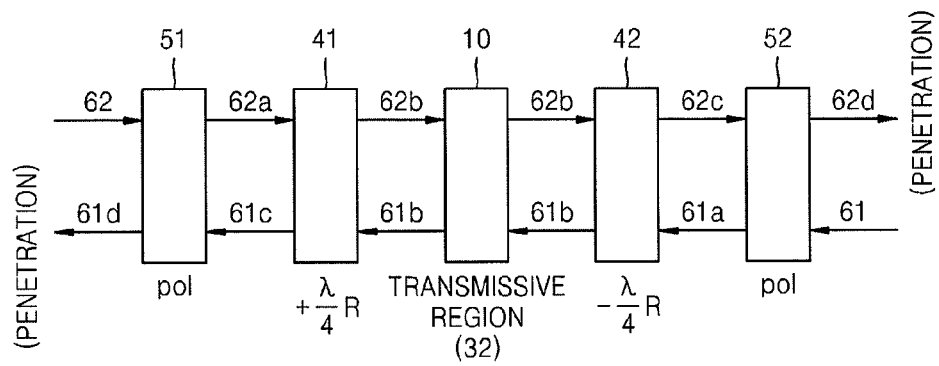
FIGS. 15 through 18 illustrate diagrams of a transmittance of external light of a display apparatus according to a combination of a polarizing plate and a retarder according to an embodiment.
Figure 16:
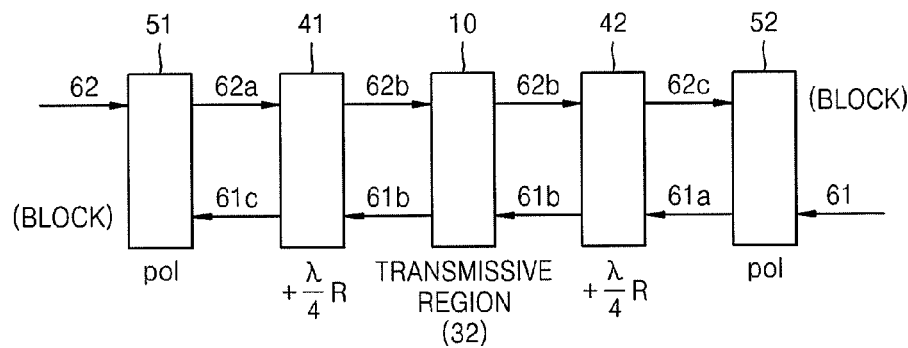

FIGS. 15 and 16 are diagrams describing adjustment of transmittance of external light of a display apparatus according to example embodiments. FIGS. 15 and 16 are described by using light proceeding in a direction opposite to a direction of an image, i.e., the second external light 62 incident on a front surface of the display apparatus, and light proceeding in the same direction as the direction of the image, i.e., the first external light 61 incident on the rear surface of the display apparatus.

FIG. 15 is a diagram describing adjustment of transmittance of external light of a display apparatus according to a relative location relationship of the transparent display device 10 and the pattern retarder 42 shown in FIG. 12A or 14A.

Referring to FIG. 15, the relative locations of the transparent display device 10 and the pattern retarder 42 are controlled such that the second retarder 421 of the pattern retarder 42 delaying the phase of the incident light by (−1/4) wavelength (−λ/4) corresponds to the transmissive region 32 of the transparent display device 10. As described above, the first retarder 41 is a retarder that delays an incident light by (+1/4) wavelength (+λ/4). Accordingly, the first retarder 41 and the second retarder 421 of the pattern retarder 42 delay the light by opposite phases, i.e., same absolute values but different directions. In addition, the first polarizer 51 and the second polarizer 52 have polarization axes in the same direction.

The second external light 62 that passes through the first polarizer 51 is linearly polarized and emerges from the first polarizer 51 as linearly polarized second external light 62a. Next, the linearly polarized light passes through the first retarder 41 and emerges as external light 62b having a phase delayed by (+1/4) wavelength (+λ/4). Next, external light 62b passes through the transmissive region 32 of the transparent display device 10 and through the second retarder 421 of the pattern retarder 42 and emerges as external light 62c having a phase delayed by (−1/4) wavelength (−λ/4). Next, external light 62c passes through the second polarizer 52 to be linearly polarized and emerge as external light 62d.

Similarly, the first external light 61 is incident on the second polarizer 52 and is linearly polarized to emerge from the second polarizer 52 as external light 61a. The external light 61a passes through the second retarder 421 of the pattern retarder 42 to emerge as external light 61b having a phase delayed by (−1/4) wavelength (−λ/4). The external light 61b passes through the transmissive region 32 of the transparent display device 10 and through the first retarder 41 to emerge as external light 61c having a phase delayed by (+1/4) wavelength (+λ/4). The external light 61c passes through the first polarizer 51 and is polarized to emerge as external light 61d from the first polarizer 51.

As a result, as shown in FIG. 15, when the first polarizer 51 and the second polarizer 52 have polarization axes in the same direction, and a location of a retarder in the pattern retarder 42, which corresponds to the transmissive region 32 of the pattern retarder 42, is controlled to have a different, e.g., opposite, phase delay value from the first retarder 41, the first and second external lights 61 and 62 penetrate through all the optical elements. In other words, a transparent mode of the display apparatuses 100 through 400 may be easily realized by determining a phase delay value of an external light penetrated through via location control of the pattern retarder 42. The user may view an image via light emitted from the pixel region 31 of the transparent display device 10.

FIG. 16 is a diagram describing adjustment of transmittance of external light of a display apparatus according to a relative location relationship of the transparent display device 10 and the pattern retarder 42 shown in FIG. 12B, 12C, 14B, or 14C.

Referring to FIG. 16, the relative locations of the transparent display device 10 and the pattern retarder 42 are controlled such that the third retarder 422 of the pattern retarder 42 delaying the phase of the incident light by (+1/4) wavelength (+λ/4) corresponds to the transmissive region 32 of the transparent display device 10. As described above, the first retarder 41 is a retarder that delays an incident light by (+1/4) wavelength (+λ/4). Accordingly, the first retarder 41 and the third retarder 422 of the pattern retarder 42 delay the incident light by the same phase, i.e., same absolute values and direction. In addition, the first polarizer 51 and the second polarizer 52 have polarization axes in the same direction.

That is, referring to FIG. 16, the second external light 62 turns into external light 62a that is linearly polarized by passing through the first polarizer 51. The external light 62a turns into external light 62b having a phase delayed by (+1/4) wavelength (+λ/4) by passing through the first retarder 41. The external light 62b turns into external light 62c having a phase delayed by (+1/4) wavelength (+λ/4) by passing through the transmissive region 32 of the transparent display device 10 and passing through the third retarder 422 of the pattern retarder 42. The external light 62c is linearly polarized in the same direction as the first polarizer 51 by passing through the second polarizer 52, and is blocked.

Similarly, the first external light 61 turns into external light 61a that is linearly polarized by passing through the second polarizer 52. The external light 61a turns into external light 61b having a phase delayed by (+1/4) wavelength (+λ/4) by passing through the third retarder 422 of the pattern retarder 42. The external light 61b turns into external light 61c having a phase delayed by (+1/4) wavelength (+λ/4) by passing through the transmissive region 32 of the transparent display device 10 and passing through the first retarder 41. The external light 61c is linearly polarized in the same direction as the second polarizer 52 by passing through the first polarizer 51, and is blocked.

As a result, as shown in FIG. 16, when the first polarizer 51 and the second polarizer 52 have polarization axes in the same direction, and a location of a retarder in the pattern retarder 42, which corresponds to the transmissive region 32 of the pattern retarder 42, is controlled to have the same phase delay value as the first retarder 41, the first and second external lights 61 and 62 are blocked. In other words, a black mode of the display apparatuses 100 through 400 may be easily realized by determining a phase delay value of an external light penetrated through via location control of the pattern retarder 42. The user may view an image via light emitted from the pixel region 31 of the transparent display device 10.

As shown in FIGS. 15 and 16, in example embodiments, the first polarizer 51 and the second polarizer 52 have polarization axes in the same direction, and the relative locations of the transparent display device 10 and the pattern retarder 42 are controlled by physically moving the pattern retarder 42. Thus, the display apparatuses 100 through 400 may be easily switched between the transparent mode and the black mode.

Figure 17:
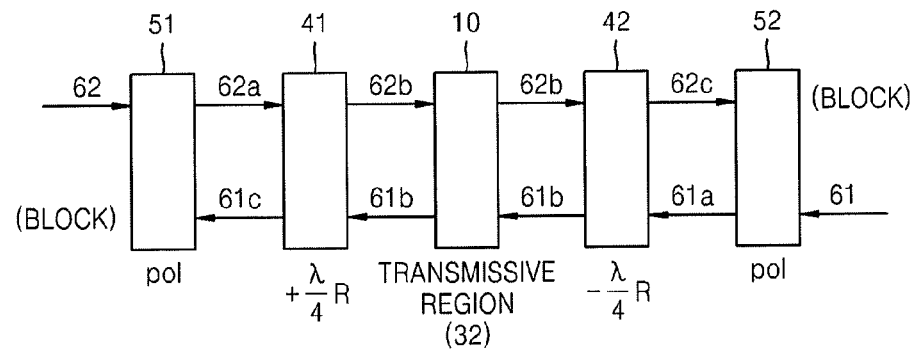
Figure 18:
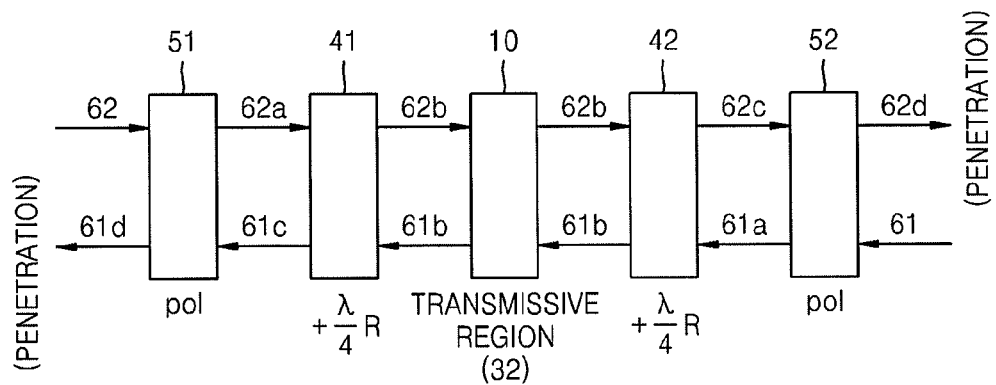

FIGS. 17 and 18 are diagrams for describing adjustment of transmittance of external light of a display apparatus according to a combination of a polarizing plate and a retarder, according to another embodiment of the example embodiments. FIGS. 17 and 18 are described by using light proceeding in a direction opposite to a direction of an image, i.e., the second external light 62, and light proceeding in the same direction as the direction of the image, i.e., the first external light 61.

FIG. 17 is a diagram for describing adjusting of a transmittance of external light of a display apparatus according to a relative location relationship of the transparent display device 10 and the pattern retarder 42 shown in FIG. 12A or 14A.

Referring to FIG. 17, the relative locations of the transparent display device 10 and the pattern retarder 42 are controlled such that the second retarder 421 of the pattern retarder 42 delaying the phase of the incident light by (−1/4) wavelength (−λ/4) corresponds to the transmissive region 32 of the transparent display device 10. As described above, the first retarder 41 is a retarder that delays an incident light by (+1/4) wavelength (+λ/4). Accordingly, the first retarder 41 and the second retarder 421 of the pattern retarder 42 delay the incident light by opposite phases, i.e., by the same absolute values but different directions. In addition, a polarization axis of the first polarizer 51 is perpendicular to a polarization axis of the second polarizer 52.

The second external light 62 turns into external light 62a that is linearly polarized by passing through the first polarizer 51. The external light 62a turns into the external light 62b having a phase delayed by (+1/4) wavelength (+λ/4) by passing through the first retarder 41. The external light 62b turns into external light 62c having a phase delayed by (−1/4) wavelength (−λ/4) by passing through the transmissive region 32 of the transparent display device 10 and passing through the second retarder 421 of the pattern retarder 42. The external light 62c is linearly polarized in a direction different from the first polarizer 51 by passing through the second polarizer 52, and is blocked.

The first external light 61 turns into external light 61a that is linearly polarized by passing through the second polarizer 52. The external light 61a turns into external light 61b having a phase delayed by (−1/4) wavelength (−λ/4) by passing through the second retarder 421 of the pattern retarder 42. The external light 61b turns into external light 61c having a phase delayed by (+1/4) wavelength (+λ/4) by passing through the transmissive region 32 of the transparent display device 10 and passing through the first retarder 41. The external light 61c is linearly polarized in a direction different from the second polarizer 52 by passing through the first polarizer 51, and is blocked.

As a result, as shown in FIG. 17, when the first polarizer 51 and the second polarizer 52 have polarization axes perpendicular to each other, and a location of a retarder in the pattern retarder 42, which corresponds to the transmissive region 32 of the pattern retarder 42, is controlled to have a different phase delay value from the first retarder 41, the first and second external lights 61 and 62 are blocked. In other words, a black mode of the display apparatuses 100 through 400 may be easily realized by determining a phase delay value of an external light penetrated through via location control of the pattern retarder 42. The user may view an image via light emitted from the pixel region 31 of the transparent display device 10.

FIG. 18 is a diagram for describing adjusting of transmittance of external light of a display apparatus according to a relative location relationship of the transparent display device 10 and the pattern retarder 42 shown in FIG. 12B, 12C, 14B, or 14C.

Referring to FIG. 18, the relative locations of the transparent display device 10 and the pattern retarder 42 are controlled such that the third retarder 422 of the pattern retarder 42 delaying the phase of the incident light by (+1/4) wavelength (+λ/4) corresponds to the transmissive region 32 of the transparent display device 10. As described above, the first retarder 41 is a retarder that delays an incident light by (+1/4) wavelength (+λ/4). Accordingly, the first retarder 41 and the third retarder 422 of the pattern retarder 42 delay the incident light by the same phase, i.e., same absolute values and direction. In addition, the polarization axis of the first polarizer 51 is perpendicular to the polarization axis of the second polarizer 52.

The second external light 62 turns into the external light 62a that is linearly polarized by passing through the first polarizer 51. The external light 62a turns into the external light 62b having a phase delayed by (+1/4) wavelength (+λ/4) by passing through the first retarder 41. The external light 62b turns into the external light 62c having a phase delayed by (+1/4) wavelength (+λ/4) by passing through the transmissive region 32 of the transparent display device 10 and passing through the third retarder 422 of the pattern retarder 42. The external light 62c turns into the external light 62d by being linearly polarized in a different direction from the first polarizer 51 by passing through the second polarizer 52.

The first external light 61 turns into the external light 61a that is linearly polarized by passing through the second polarizer 52. The external light 61a turns into the external light 61b having a phase delayed by (+1/4) wavelength (+λ/4) by passing through the third retarder 422 of the pattern retarder 42. The external light 61b turns into the external light 61c having a phase delayed by (+1/4) wavelength (+λ/4) by passing through the transmissive region 32 of the transparent display device 10 and passing through the first retarder 41. The external light 61c turns into the external light 61d by being linearly polarized in a different direction from the second polarizer 52 by passing through the first polarizer 51.

As a result, as shown in FIG. 18, when the first polarizer 51 and the second polarizer 52 have polarization axes perpendicular to each other, and a location of a retarder in the pattern retarder 42, which corresponds to the transmissive region 32 of the pattern retarder 42, is controlled to have the same phase delay value as the first retarder 41, the first and second external lights 61 and 62 penetrate. In other words, a transparent mode of the display apparatuses 100 through 400 may be easily realized by determining a phase delay value of an external light penetrated through via location control of the pattern retarder 42. The user may view an image via light emitted from the pixel region 31 of the transparent display device 10.

As shown in FIGS. 17 and 18, in example embodiments, the first polarizer 51 and the second polarizer 52 have polarization axes perpendicular to each other, and the relative locations of the transparent display device 10 and the pattern retarder 42 are controlled by physically moving the pattern retarder 42. Thus, the display apparatuses 100 through 400 may be easily switched between the transparent mode and the black mode.

Figure 19:
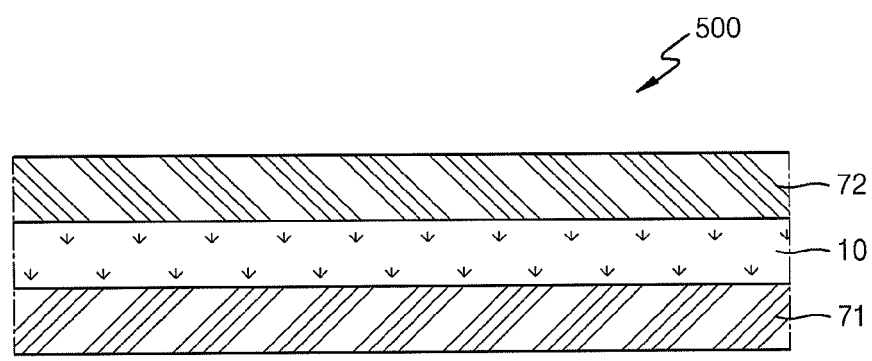
FIG. 19 illustrates a schematic diagram of an operation of a display apparatus according to another embodiment.

FIG. 19 is a diagram for schematically describing an operation of a display apparatus 500 according to another embodiment. Referring to FIG. 19, the display apparatus 500 may include a first circular polarizer 71 disposed on an optical path emitted by the transparent display device 10, and a second circular polarizer 72 disposed opposite to the optical path emitted by the transparent display device 10. The first circular polarizer 71 replaces a combination of the first retarder 41 and the first polarizer 51 of any one of the display apparatuses 100 through 400 described above, and the second circular polarizer 72 replaces a combination of the pattern retarder 42 and the second polarizer 52. Since functions and operations of other elements are substantially the same to those of the display apparatuses 100 through 400 described above, descriptions thereof are not provided.

The first circular polarizer 71 circularly polarizes incident light by delaying a phase of the incident light by (+1/4) wavelength (+λ/4). The second circular polarizer 72 has a polarization axis that is the same as or perpendicular to the first circular polarizer 71 and has a pattern in which a first delay region delaying a phase of an incident light by (−1/4) wavelength (−λ/4) and a second delay region delaying the phase of the incident light by (+1/4) wavelength (+λ/4) are repeatedly arranged. The first and second delay regions may have perpendicular slow axes.

Accordingly, the display apparatus 500 may move the second circular polarizer 72 up and down or left and right by using the location changing unit 80, such that the first or second delay region corresponds to the transmissive region 32 of the transparent display device 10. Therefore, the display apparatus 500 transmits or blocks the external light of the display apparatus 500.

The display apparatus 500 of FIG. 19 may be manufactured by reducing two processes of disposing a retarder and a linear polarizer to one process of disposing a circular polarizer. Also, processes are simplified by adjusting an anti-reflection (AR) characteristic of the circular polarizer without having to separately adjust an AR characteristic of a retarder.

According to an embodiment, optical elements may be organized outside, i.e., on outer surfaces of, a transparent display device, thereby controlling transmittance of external light therethrough with low power and minimized number of optical elements. Accordingly, the display apparatus may have a decreased weight, a reduced number of manufacturing processes, reduced material costs, and reduced defection rate. Further, transmittance in the transparent display device increases in a transparent mode and decreases in a black mode.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the example embodiments as set forth in the following claims.

What is claimed is:

1. A display apparatus capable of controlling light transmittance, the display apparatus comprising:
   a transparent display device including first and second regions, the first region being configured to display images, the second region being configured to transmit external light therethrough, and the first and second regions being adjacent to each other and being alternately arranged in a first direction;
   a first polarizer on the transparent display device, the first polarizer being in an optical path of light emitted by the transparent display device and being configured to linearly polarize the external light;
   a first retarder between the first polarizer and the transparent display device, the first retarder being configured to delay a phase of the external light;
   a second polarizer on the transparent display device, the second polarizer being on an opposite surface of the transparent display device relative to the first polarizer and being configured to linearly polarize the external light; and
   a pattern retarder between the second polarizer and the transparent display device, the pattern retarder including a second retarder configured to delay a wavelength of the external light by a first phase and a third retarder configured to delay the wavelength by a second phase, the second and third retarders being alternately arranged in the first direction.

2. The display apparatus as claimed in claim 1, wherein the first retarder is configured to delay the external light by the first phase.

3. The display apparatus as claimed in claim 2, wherein the first polarizer and the second polarizer have polarization axes in a same direction.

4. The display apparatus as claimed in claim 3, wherein:
   the first and second phases have same absolute values and different rotation directions, and
   when a location of the pattern retarder is adjusted to have the third retarder correspond to the second region of the transparent display device, the display apparatus transmits the external light.

5. The display apparatus as claimed in claim 3, wherein:
   the first and second phases have same absolute values and different rotation directions, and
   when a location of the pattern retarder is adjusted to have the second retarder correspond to the second region of the transparent display device, the display apparatus blocks the external light.

6. The display apparatus as claimed in claim 2, wherein the first polarizer and the second polarizer have polarization axes perpendicular to each other.

7. The display apparatus as claimed in claim 6, wherein:
   the first and second phases have same absolute values and different rotation directions, and
   when a location of the pattern retarder is adjusted to have the third retarder correspond to the second region of the transparent display device, the display apparatus blocks the external light.

8. The display apparatus as claimed in claim 6, wherein:
   the first and second phases have same absolute values and different rotation directions, and
   when a location of the pattern retarder is adjusted to have the second retarder correspond to the second region of the transparent display device, the display apparatus transmits the external light.

9. The display apparatus as claimed in claim 1, further comprising a location changing unit to move the pattern retarder up or down along the first direction by a half of a pixel pitch, the first direction extending along a vertical direction, and the second and third retarders of the pattern retarder corresponding to the first and second regions.

10. The display apparatus as claimed in claim 1, further comprising a location changing unit to move the pattern retarder left or right along the first direction by a half of a pixel pitch, the first direction extending along a horizontal direction, and the second and third retarders of the pattern retarder corresponding to the first and second regions.

11. The display apparatus as claimed in claim 1, wherein slow axes of the second and third retarders are perpendicular to each other.

12. The display apparatus as claimed in claim 1, wherein a sum of a number of second retarders and a number of third retarders in the pattern retarder is greater by one than twice a number of second regions in the transparent display device.

13. The display apparatus as claimed in claim 12, wherein the number of second retarders is different by one than the number of third retarders.

14. The display apparatus as claimed in claim 1, further comprising a location changing unit configured to move the pattern retarder by a half of a pixel pitch along the first direction.

15. The display apparatus as claimed in claim 1, wherein the pattern retarder includes a plurality of the second retarders and a plurality of the third retarders, the plurality of the second and third retarders being arranged in an alternating pattern mirroring the alternating arrangement of the first and second regions.

16. A display apparatus capable of controlling a light transmittance, the display apparatus comprising:
a transparent display device including first and second regions, the first region being configured to display images, the second region being configured to transmit external light therethrough, and the first and second regions being adjacent to each other and being alternately arranged in a first direction;
a first circular polarizer in an optical path of light emitted by the transparent display device, the first circular polarizer being configured to delay and circularly polarize a wavelength of the external light by a first phase; and
a second circular polarizer opposite to the optical path emitted by the transparent display device, the second circular polarizer including a first delay region for delaying the external light by the first phase and a second delay region for delaying the external light by a second phase, the first and second delay regions being alternately arranged in the first direction, and the second circular polarizer being configured to delay and circularly polarize the wavelength of the external light by the first phase or the second phase.

17. The display apparatus as claimed in claim 16, wherein:
the first circular polarizer includes a first linear polarizer and a first retarder disposed between the first linear polarizer and the transparent display device to delay the wavelength of the external light by the first phase, and
the second circular polarizer includes a second linear polarizer and a pattern retarder disposed between the second linear polarizer and the transparent display device, the pattern retarder including a second retarder delaying the wavelength of the external light by the first phase, and a third retarder delaying the wavelength by the second phase, the second and third retarders being alternately arranged.

18. The display apparatus as claimed in claim 16, wherein:
the first and second phases have same absolute values and different rotation directions,
the first circular polarizer and the second circular polarizer have polarization axes in a same direction, and
the display apparatus further includes a location changing unit for blocking or transmitting the external light by adjusting relative locations of the second circular polarizer and the transparent display device to have the first or second delay region of the second circular polarizer correspond to the second region of the transparent display device.

19. The display apparatus as claimed in claim 16, wherein:
the first and second phases have same absolute values and different rotation directions,
the first circular polarizer and the second circular polarizer have polarization axes perpendicular to each other, and
the display apparatus further includes a location changing unit for blocking or transmitting the external light by adjusting relative locations of the second circular polarizer and the transparent display device to have the first or second delay region of the second circular polarizer correspond to the second region the transparent display device.

20. The display apparatus as claimed in claim 16, wherein:
the first and second regions of the transparent display device have patterns alternately repeating in a horizontal or vertical direction, and
the first and second delay regions of the second circular polarizer have patterns alternately repeating in a same direction as the first and second regions of the transparent display device.

21. A display apparatus capable of controlling a light transmittance, the display apparatus comprising:
a transparent display device including a first substrate with pixels and a second substrate sealing the first substrate, each pixel including first and second regions, the first region being configured to display images, the second region being configured to transmit external light therethrough, and the first and second regions being adjacent to each other and being alternately arranged in a first direction;
a first linear polarizer on a first surface of the transparent display device;
a first retarder between the first linear polarizer and the first surface of the transparent display device to delay the external light by a first phase;
a second linear polarizer on a second surface of the transparent display device, the second surface being opposite the first surface; and
a pattern retarder between the second polarizer and the second surface of the transparent display device, the pattern retarder including a second retarder for delaying a wavelength of the external light by a second phase and a third retarder for delaying the wavelength by a third phase, the second and third retarders being alternately and repeatedly arranged.

22. The display apparatus as claimed in claim 21, wherein the first and second phases are the same, and the first and third phases have same absolute values and different rotation directions.

23. The display apparatus as claimed in claim 22, wherein:
the first linear polarizer and the second linear polarizer have polarization axes in a same direction, and
the display apparatus further comprises a location changing unit for blocking or transmitting the external light by adjusting relative locations of the pattern retarder and the transparent display device to have the second or third retarder correspond to the second region of the transparent display device.

24. The display apparatus as claimed in claim 22, wherein:
the first linear polarizer and the second linear polarizer have polarization axes perpendicular to each other, and
the display apparatus further comprises a location changing unit for blocking or transmitting the external light by adjusting relative locations of the pattern retarder and the transparent display device to have the second or third retarder correspond to the second region the transparent display device.

25. The display apparatus as claimed in claim 21, wherein:
the first and second regions of the transparent display device have patterns alternately repeated in a horizontal or vertical direction, and
the second and third retarders of the pattern retarder have patterns alternately arranged in a same direction as the first and second regions of the transparent display device.

26. The display apparatus as claimed in claim 21, wherein the first retarder is between the first substrate and the first polarizer, and the pattern retarder is between the second substrate and the second polarizer.

27. The display apparatus as claimed in claim 21, wherein the first retarder is between the second substrate and the first polarizer, and the pattern retarder is between the first substrate and the second polarizer.

* * * * *